United States Patent
Wunderer

(10) Patent No.: US 11,988,868 B2
(45) Date of Patent: May 21, 2024

(54) FORMING OPTICAL COMPONENTS USING SELECTIVE AREA EPITAXY

(71) Applicant: Palo Alto Research Center Incorporated, Palo Alto, CA (US)

(72) Inventor: Thomas Wunderer, Santa Cruz, CA (US)

(73) Assignee: XEROX CORPORATION, Norwalk, CT (US)

( * ) Notice: Subject to any disclaimer, the term of this patent is extended or adjusted under 35 U.S.C. 154(b) by 645 days.

(21) Appl. No.: 17/159,406

(22) Filed: Jan. 27, 2021

(65) Prior Publication Data

US 2022/0236485 A1    Jul. 28, 2022

(51) Int. Cl.
| | |
|---|---|
| C30B 25/04 | (2006.01) |
| C30B 29/40 | (2006.01) |
| G02B 6/122 | (2006.01) |
| H01L 21/02 | (2006.01) |
| G02B 6/12 | (2006.01) |

(52) U.S. Cl.
CPC ............ G02B 6/1225 (2013.01); C30B 25/04 (2013.01); C30B 29/403 (2013.01); H01L 21/02642 (2013.01); G02B 2006/1213 (2013.01); G02B 2006/12178 (2013.01)

(58) Field of Classification Search
CPC ..... C30B 25/04; C30B 29/403; G02B 6/1225; G02B 2006/1213; G02B 2006/12178; H01L 21/02642
See application file for complete search history.

(56) References Cited

U.S. PATENT DOCUMENTS

| | | | |
|---|---|---|---|
| 5,705,321 A * | 1/1998 | Brueck | H01L 21/0274 430/394 |
| 6,015,979 A * | 1/2000 | Sugiura | H01L 33/025 257/86 |
| 6,917,729 B2 | 7/2005 | Zediker et al. | |
| 2004/0124435 A1 | 7/2004 | D Evelyn et al. | |
| 2009/0309127 A1 | 12/2009 | Raring et al. | |
| 2010/0230711 A1 * | 9/2010 | Kuo | H01L 33/0093 257/E33.056 |

OTHER PUBLICATIONS

Tabataba-Vakili et al., "Blue Microlasers Integrated on a Photonic Platform on Silicon", ACS Photonics, 2018, 5, pp. 3643-3648.

* cited by examiner

*Primary Examiner* — Robert M Kunemund
(74) *Attorney, Agent, or Firm* — Mueting Raasch Group

(57) ABSTRACT

A mask material is deposited on a substrate or growth template. The substrate or growth template is compatible with crystalline growth of a crystalline optical material. Patterned portions of the mask material are removed to expose one or more regions of the substrate or growth template. The one or more regions have target shapes of one or more optical components. The crystalline optical material is selectively grown in the one or more regions to form the one or more optical components.

16 Claims, 7 Drawing Sheets

FORMING OPTICAL COMPONENTS USING SELECTIVE AREA EPITAXY

SUMMARY

The present disclosure is directed to forming optical components using selective area epitaxy. In one embodiment, a method involves depositing a mask material on a substrate or growth template. The substrate or growth template is compatible with crystalline growth of a crystalline optical material. Patterned portions of the mask material are removed to expose one or more regions of the substrate or growth template. The one or more regions have target shapes of one or more optical components. The crystalline optical material is selectively grown in the one or more regions to form the one or more optical components.

In another embodiment, a method involves forming one or more voids in a mask material. The mask material is on a substrate or growth template, and the substrate or growth template is compatible with crystalline growth of a crystalline optical material. The voids have target shapes of one or more optical components. The mask material is temperature annealed to reduce sidewall roughness of the mask material surrounding the voids. The crystalline optical material is selectively grown in the voids to form the one or more optical components.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

The present disclosure is generally related to the design of optical devices, such as photonic integrated circuits (PICs). These devices can be used in many applications. For example, ultrashort optical pulses (optical frequency combs, supercontinuum sources, etc.) have garnered much attention for their unique potential in optical metrology, information processing, and more recently quantum information processing applications, to name a few. There are molecular fingerprints in the ultra-violet (UV) part of the electromagnetic spectrum, which makes coherent optical sources at such wavelengths highly desirable for spectroscopic applications. Also, there are atomic transitions at UV wavelengths (e.g., Yb+) which can be used for developing accurate atomic clocks or scalable quantum computers using trapped ions/atoms within integrated photonics platforms. Furthermore, there has been interest in quantum computing for qubit initialization and logic-gate operations performed with short optical pulses and in the use of the Raman transition between atomic levels, which can enable integrated photonic platforms for quantum information processing.

In order to provide the performance needed for these PICs, the components of the optical devices (e.g., waveguides, couplers, phase shifters, etc.), the devices should be fabricated to precise dimensions. Current state-of-the-art PIC components in III-Nitrides (III-N) are fabricated through subtractive fabrication steps. For example, a thin film (e.g., AlN on sapphire) is etched using dry etching techniques such as reactive ion etching (RIE) or inductively coupled plasma etching (ICP-RIE). This limits the achievable performance and design options of III-N PIC components.

Figure 1A:
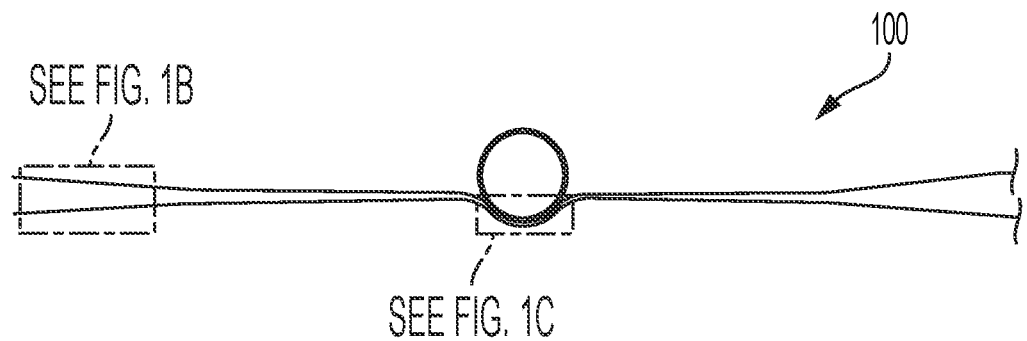
FIGS. 1A-1C are plan views of an optical device that can be manufactured by a method according to an example embodiment.
Figure 1B:
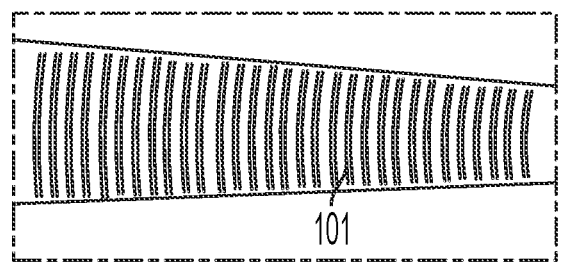
Figure 1C:
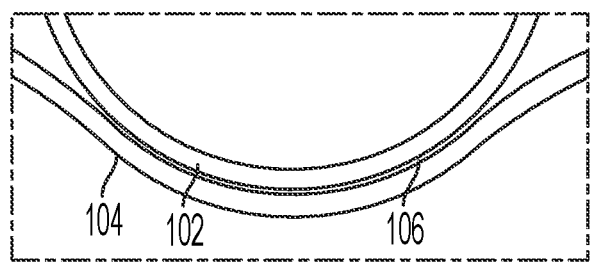

For example, dry etching is known to introduce etch-induced defects and side wall roughness that both contribute to increased losses through absorption and scatter centers. Thus, quality Q factors of ring-resonators, a popular PIC element for example, are significantly compromised (see, e.g., Tabataba-Vakili et al., ACS Photonics 2018 5 (9), 3643-3648). An example of a coupled ring resonator 100 is shown in the diagram of FIGS. 1A-1C.

The edge smoothness of features such as a grating coupler 101 and waveguides 102, 104 can significantly affect the quality factor of the resonator 100. The coupled ring resonator 100 may also include features with high aspect ratios that are hard to realize when using conventional etching. For example, the coupled ring resonator 100 may utilize a small gap 106 (e.g., ~50 nm) between two thick (>500 nm) waveguides 102, 104 for efficient evanescent coupling. Thus an aspect ratio in such a case may be greater than ~500/50=~10. High aspect ratios such as this (e.g., 5 or greater) between a thickness of the optical component and a gap (e.g., containing a mask material, cladding, air, etc.) between an adjacent optical component may be desired for operation in the UV/VIS spectral range where III-Nitrides show their greatest benefits. Using conventional fabrication techniques such as dry etching, typical waveguide thicknesses may need to be limited in structures like this, which may be undesirable for various PIC implementations.

Embodiments described herein facilitate fabricating high quality PIC components that are based, for example, on III-Nitride semiconductor materials. These are single-crystalline materials featuring low losses (e.g., low absorption and low intrinsic scattering). The techniques include bottom-up fabrication with few or no etching induced defects. This results in very smooth side wall roughness for low scattering at waveguide boundaries. The process can be used to build optical heterostructures for passive and active PIC components, e.g., dispersion engineering, laser heterostructures, phase shifters, etc. The processes can implement intentional doping profiles and realizes small feature sizes, e.g., for evanescent coupling.

Instead of using etching to define lateral structuring of the materials, processes described herein use selective area epitaxy for lateral definition of the III-N materials. In this type of process, a growth template or substrate (e.g., epitaxial AlN on sapphire or bulk AlN substrate) receives a patterned mask (e.g., $SiO_2$) with openings to the substrate or growth template. Using proper growth conditions in an epitaxial process (e.g., metal-organic vapor phase epitaxy (MOVPE), molecular beam epitaxy (MBE), chemical beam epitaxy (CBE), etc.) crystalline semiconductor material is grown under conditions that primarily promote crystalline growth out of the mask openings, but not on the mask. The mask that was used for the selective area growth can either remain as deposited, e.g., to act as cladding material or it can be selectively (wet) etched using well known etchants (e.g., HF for $SiO_2$) that attack the mask material but not the III-N. Unintentional depositions on the mask material can be removed with the removal of the mask material if desired. Thus, optical devices can be fabricated with crystalline materials of high quality with superior fabrication finishes. The process can be used to form complex heterostuctures for many different active and passive PIC functions.

Selective area epitaxy of III-Nitrides has been used in the past for improving the material quality of GaN when grown on a foreign substrate like sapphire. This was when no native III-Nitride substrates were yet developed. Using selective area growth (SAG) allows improving the initial (inferior) material quality by intentionally laterally overgrowing the mask material. The material quality of the "wing" region typically features a significant reduction of threading dislocations, and allowed realizing the first demonstration of laser operation with III-Nitrides. In that application, the mask thickness is typically kept quite thin, e.g., 50-200 nm.

In the embodiments described herein, the mask thickness can approximate the height of the final waveguide thickness, or be thicker (e.g., >200 to 1000 nm or more). In some embodiments, the intention is to not significantly overgrow the mask. The mask allows for a bottom-up fabrication method of the epitaxial material for PIC elements allowing extremely smooth side walls with no etch-induced defects, enables extreme aspect ratios, and allows for complex heterostructures with the option of doped and undoped regions, enabling fully integrated active and passive III-Nitride PIC components and circuits.

Figure 2:
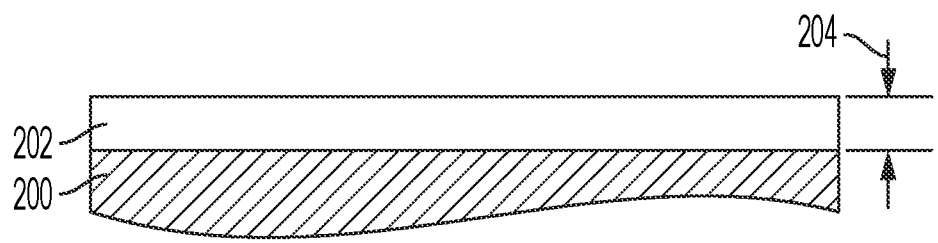
FIGS. 2-7 are side views of a process for manufacturing optical devices according to an example embodiment.

In FIGS. 2-7, diagrams show steps in an optical fabrication process according to an example embodiment. In FIG. 2, a substrate 200 is shown, which may include a substrate of single optical material (e.g., AlN) or a template of a first material or first set of materials (e.g., AlN) formed on a substrate of another material or materials (e.g., Si or $Al_2O_3$). The substrate 200 (or template if used) is compatible with crystalline growth of a crystalline optical material, e.g., a III-V compound.

Figure 3:
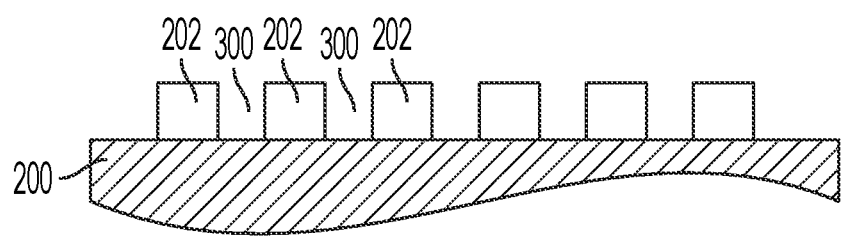

A mask material 202 is deposited on the substrate 200. The mask material 202 may be an amorphous material, such as $SiO_2$, or may be a crystalline material, such as AlN. The layer of mask material 202 is formed to a thickness 204 that is approximately the height of the desired optical components. For example, the mask material 202 may be ~1 micron thick. As seen in FIG. 3, the mask material 202 is patterned, e.g., using e-beam lithography, photo-lithography, or direct laser writing into a resist from which a pattern is subsequently transferred into the mask material 202 through etching (e.g., with reactive ion etching (RIE)). The patterning generally involves depositing a photo- or e-beam resist layer (not shown), patterning of the resist, removing (e.g., etching through) portions of the mask material 202, then removing the photoresist. See FIGS. 9 and 10 for details of the photoresist application and etch.

The material removal of portions of the mask material 202 creates voids that expose one or more regions 300 of the substrate or growth template 200. For purposes of this disclosure, the regions 300 may be considered interchangeable with the voids in the mask material 202 that outline/define the regions 300. The one or more regions/voids 300 have target shapes of one or more optical components that will be formed in subsequent steps.

Figure 4:
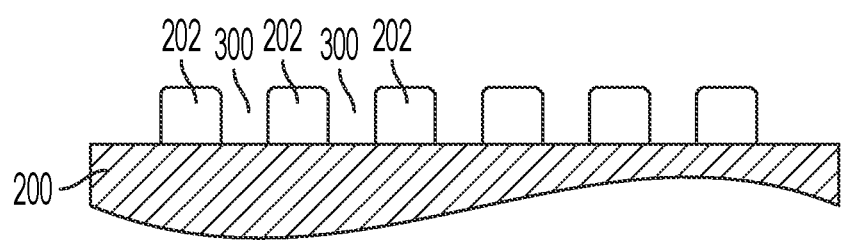
Figure 5:
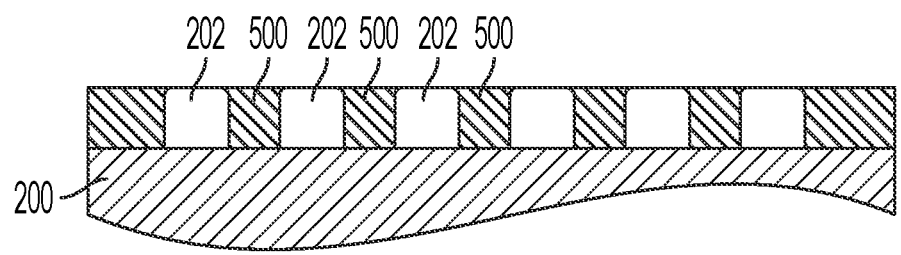

As seen in FIG. 4, the substrate 200 and mask material 202 may undergo a temperature anneal which reduces sidewall roughness of the mask material 202 surrounding the regions/voids 300. Note that heating the substrate 200 and mask may be part of subsequent epitaxial growth steps, however the heating temperature and/or time may be adjusted to ensure good smoothing of mask edges. As seen in FIG. 5, a crystalline optical material 500 is selectively grown in the one or more regions/voids 300 to form the one or more optical components. In one embodiment, the optical material may be homogeneous throughout the growth process. In another embodiment, the process shown in FIG. 5 may involve selective area growth of a heterostructure (e.g., a III-Nitride heterostructure) with different material properties in some regions. Examples of the devices formed in this process include a passive waveguide, ring resonator, active laser gain element, and active or passive phase shifter, p-n diode, etc.

The selective growth of crystalline optical material as shown in FIG. 5 may include adding doping elements at particular times in the deposition process. In the case of III-N this may include Si, Ge for the n-type dopant and Mg for p-type doping. Also, the selective growth of crystalline optical material as shown in FIG. 5 may include the growth of dissimilar materials, e.g., the growth of heterostructures. For example, the material 500 may include a heterostructure with two guide layers having first and second dispersion responses that combine to create an anomalous dispersion about a target wavelength. Further details of this anomalous dispersion waveguide heterostructure are described in U.S. application Ser. No. 16/783,668 filed on 6 Feb. 2020, which is hereby incorporated by reference in its entirety.

Figure 6:
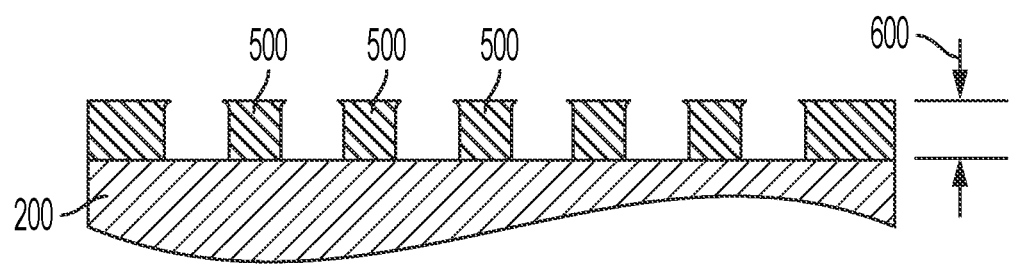
Figure 7:
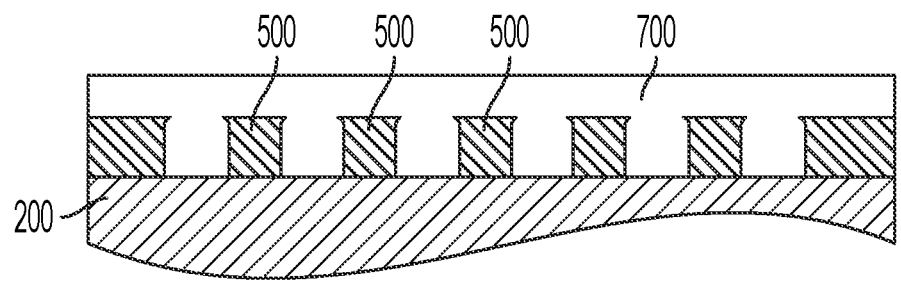

As seen in FIG. 6, the mask material 202 can optionally be removed, e.g., lifted off with a wet etchant. As seen in FIG. 7, optical cladding coating 700 can be added over the crystalline optical material (e.g., $SiO_2$). Note that if the mask material 202 is suitable as a cladding material, then an overcoating of the same or different mask material may be applied as in FIG. 7 without performing a removal as in FIG. 6. This will cause at least three sides of the material 500 to be covered by the mask/cladding material. Other material choices for the optical material 500 (e.g., other III-V, II-VI) and growth mask material 202 (e.g., SiN, TiN, etc.) are possible. Any of the cladding materials described above could be deposited (e.g., sputtering of an amorphous material such as SiO2) or grown (e.g., second MOVPE growth of a different material such as crystalline AlN).

There may be many additions or variations of the process shown in FIGS. 2-7. For example, the thickness 204 of the mask material (see FIG. 2) could be smaller than or larger than the height 600 (see FIG. 6) of the PIC components. The former could be applicable when development of crystalline side facets for optical structures (e.g., waveguides) is desired. The latter could be applicable if a flat top surface is desired for the optical structures (e.g., prevent "bowing" of the top surface of the optical structure above the mask). Additional processing such as chemical-mechanical planarization may be applied to the top surfaces seen in FIGS. 5 and 6. This could be used to smooth top surfaces, adjust mask or optical device thickness, etc. Additional materials/films can be deposited on the illustrated structures for desired optical, electrical, or mechanical functions.

Figure 8:
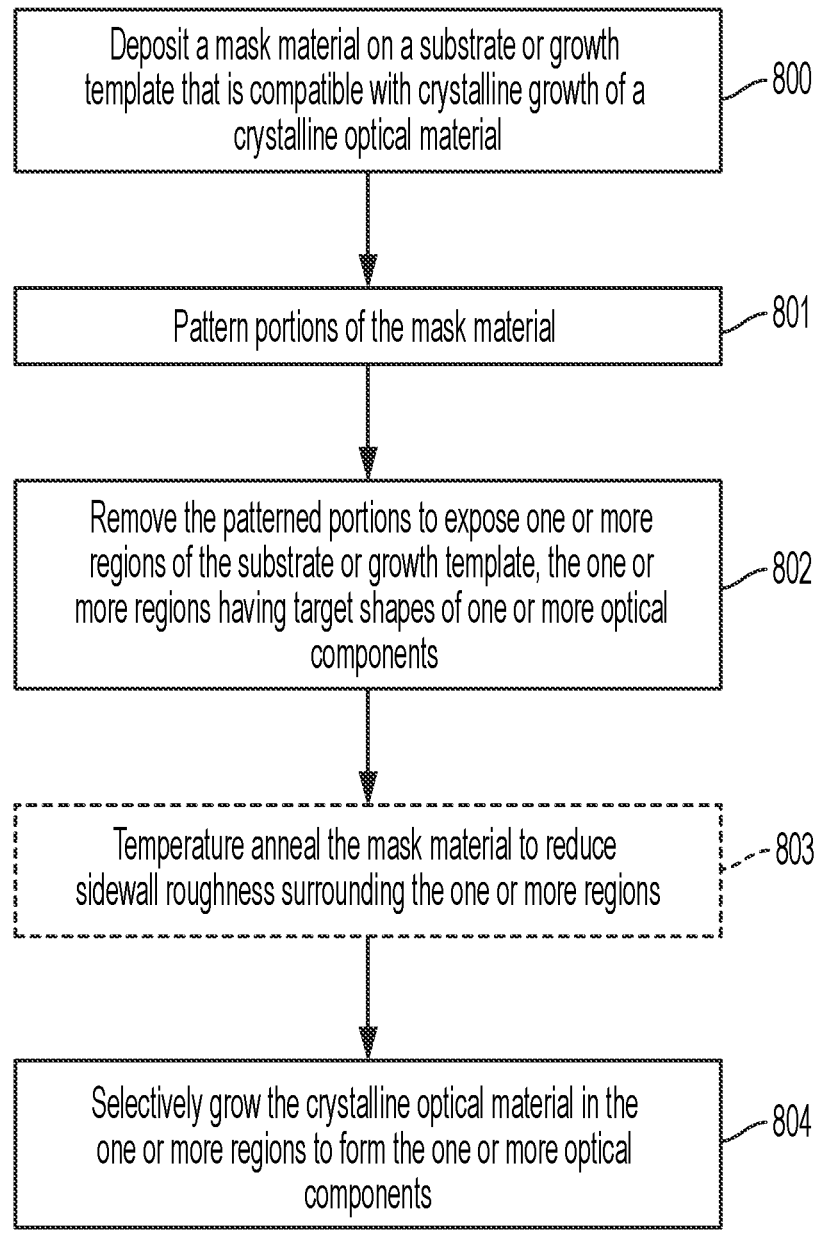
FIG. 8 is a flowchart of a method according to an example embodiment.

In FIG. 8, a flowchart shows a method according to an example embodiment. The method involves depositing 800 a mask material on a substrate or growth template. The substrate or growth template is compatible with crystalline growth of a crystalline optical material. Portions of the mask material are patterned 801 and patterned portions are removed 802 (e.g., etched) to expose one or more regions of the substrate or growth template. The one or more regions have target shapes of one or more optical components. The mask material can be optionally temperature-annealed 803 to reduce sidewall roughness of the mask material surrounding the one or more regions. The crystalline optical material is selectively grown 804 in the one or more regions to form the one or more optical components.

Figure 9:
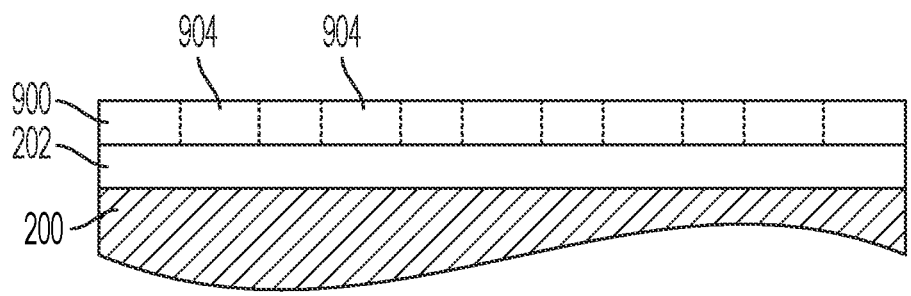
FIGS. 9-12 are side views of a process for manufacturing optical devices according to another example embodiment.

In FIGS. 9-12, a diagram shows processing steps according to another example embodiment. As seen in FIG. 9, a substrate or growth template 200 with patterned mask material 202 is shown with photoresist 900 over the mask material 202. In one embodiment, the mask material 202 is deposited first as a blanket (non-patterned) film followed by spin-coating the photoresist 900 onto the sample (also un-patterned). Then the photoresist 900 is exposed (e.g., through a lithography mask using UV light in the case of photolithography, or an electron beam in case of e-beam lithography or direct laser writing) to write the pattern into the photoresist 900. Based on the type of photoresist 900 (positive or negative) the exposed areas become hardened or dissolvable. Regions 904 indicated material that will be removed in response to the exposure. This process of exposing a photoresist is also applicable to the mask patterning shown in FIGS. 2 and 3.

Following exposure of the photo- or e-beam resist 900, a liquid developer (not shown) will remove the unwanted portions 904 in the resist resulting in corresponding patterned portions of the resist 900. The photo- or e-beam resist 900 acts as an etching mask (e.g., dry etching) to transfer the image from the resist into the growth mask 202 such that the regions/voids 300 extend through the mask layer 202. Note the feature size 1002 shown in FIG. 10, which may be on the order of 50 nm in some regions. This feature size may also be applicable to the previous embodiments, e.g., FIGS. 2-7. This size may be applicable to both the device formed and space between adjacent devices on the wafer.

Figure 10:
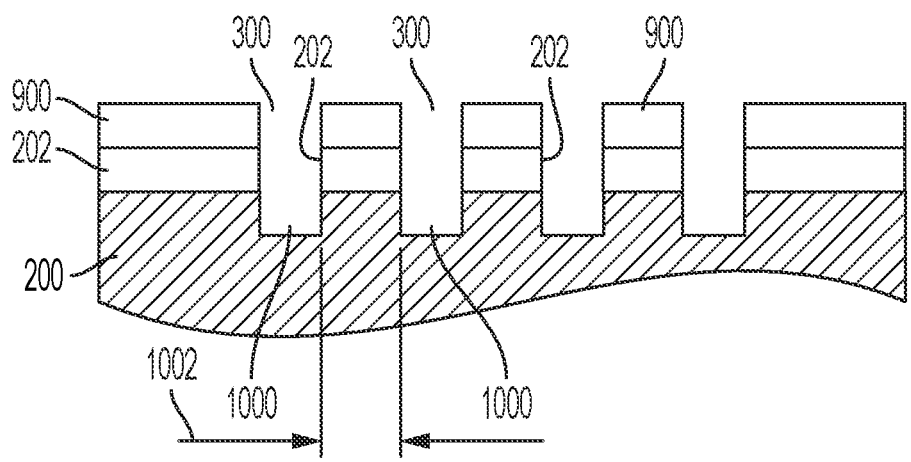
Figure 11:
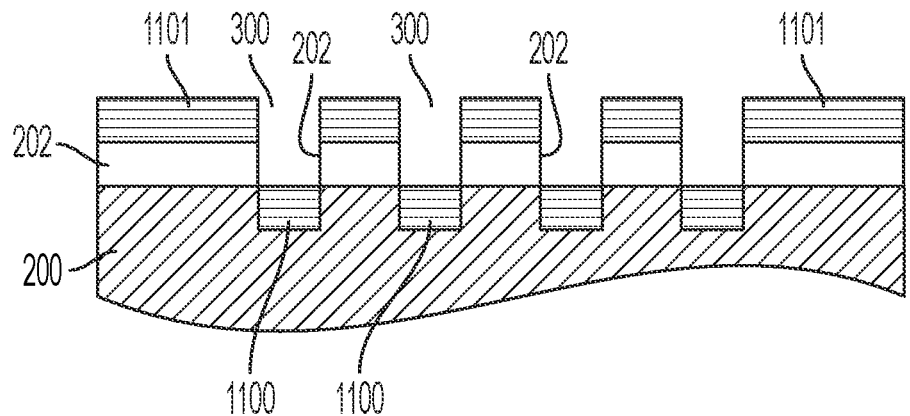

As seen in FIG. 10, the etching has created the regions/voids through the mask layer 202, and the etching has been further extended to form trenches 1000 into the substrate or growth template 200. Potentially, the etch chemistry and/or etching tool may need to be changed for the etching of the substrate 200 in comparison to just the growth mask, the latter being shown in FIG. 3. The photo- or e-beam resist 900 is shown in place in FIG. 10, and can be removed following the forming of the trenches 1000. As seen in FIG. 11, optical component structures 1100 are epitaxially grown in the trenches 1000. The structures 1100 in this example include a heterostructure, e.g., an AlGaN heterostructure. The structures 1100 within the trenches 1000 will be crystalline, and unwanted deposits 1101 on the mask 202 (if any) can be lifted-off through a wet etchant which can remove both the deposits 1101 and mask 202.

Figure 12:
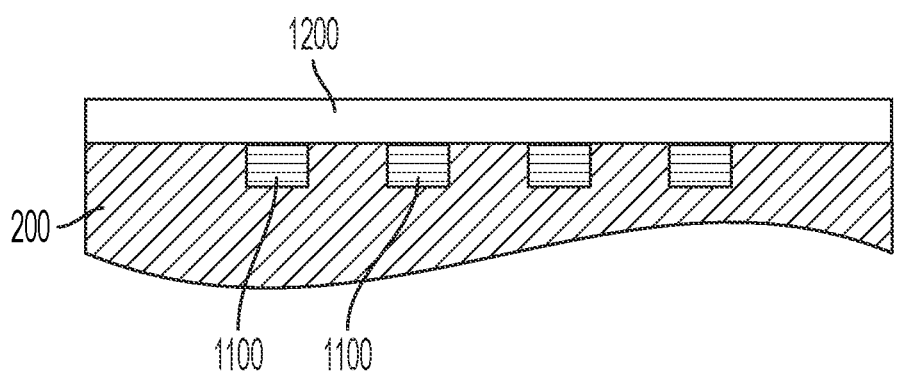

As seen in FIG. 12, a cladding 1200 is formed over the optical structures 1100. The cladding 1200 could be grown in a second epitaxial run, e.g., growing an AlN top cladding. This would provide an all-crystalline waveguide/cladding design. Alternatively the top cladding 1200 could also be deposited, e.g., non-crystalline cladding, using materials such as $SiO_2$. Note that this embodiment may include additional steps discussed for previous embodiments, e.g., planarization, growth of structures 1100 to a thickness that is less than or greater than a depth of the trenches 1000. The materials used and components formed using this process may also be the same as the previously described embodiments.

Figure 13:
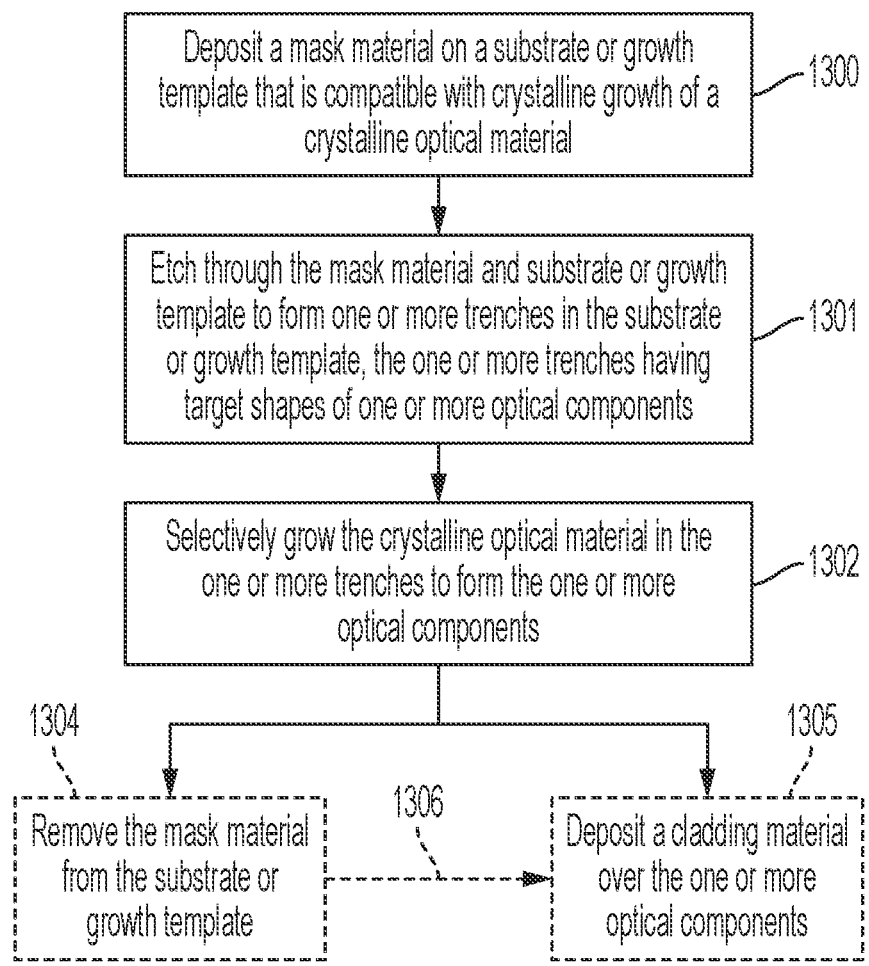
FIG. 13 is a flowchart of a method according to an example embodiment.

In FIG. 13, a flowchart shows a method according to another example embodiment. A mask material is deposited 1300 on a substrate or growth template. The substrate or growth template is compatible with crystalline growth of a crystalline optical material. An etching 1301 is performed through the mask material and substrate or growth template to form one or more trenches in the substrate or growth template. The one or more trenches have target shapes of one or more optical components. Crystalline optical material is selectively grown 1302 in the one or more trenches to form the one or more optical components. Optionally, the mask material can be removed 1304, e.g., using a lift off with a liquid etchant. A cladding material can optionally be deposited 1305 over the optical components instead of or in addition to the removal of the mask material, as indicated by path 1306. Note that if the mask material is a cladding material, then operation 1034 may not be needed before operation 1305.

Embodiments described above include epitaxy of III-V on a substrate with patterned mask for the purpose of guiding and manipulating photons in a III-V (e.g., III-N) optical waveguide. The III-V structures can be used as passive photonic integrated circuit components (waveguide, bend, coupler, ring resonator, phase shifter, etc.) and/or active photonic integrated circuit components (laser gain medium, photodetector, phase shifter, etc.). The III-V components can be simple homogenous or complex heterostructures. The III-V materials can be doped with different levels and materials during epitaxy.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method comprising:
   depositing a mask material on a substrate or growth template, the substrate or growth template compatible with crystalline growth of a crystalline optical material;
   removing patterned portions of the mask material to expose two or more regions of the substrate or growth template, the two or more regions having target shapes of two or more optical components and a gap between the two or more regions; and
   selectively growing the crystalline optical material in the two or more regions to form the two or more optical components, the gap facilitating evanescent coupling between the two or more optical components.

2. The method of claim 1, further comprising temperature-annealing the mask material to reduce sidewall roughness of the mask material surrounding the two or more regions before selectively growing the crystalline optical material.

3. The method of claim 1, further comprising, after selectively growing the crystalline optical material, removing the mask material from the substrate or growth template, using a lift off with a liquid etchant.

4. The method of claim 1, wherein the two or more optical components do not extend above the mask material, the method further comprising depositing an amorphous cladding material over the two or more optical components.

5. A method comprising:
  depositing a mask material on a substrate or growth template, the substrate or growth template compatible with crystalline growth of a crystalline optical material, wherein the mask material comprises a first cladding material;
  removing patterned portions of the mask material to expose one or more regions of the substrate or growth template, the one or more regions having target shapes of one or more optical components;
  selectively growing the crystalline optical material in the one or more regions to form the one or more optical components; and
  depositing a second amorphous cladding material over the selectively grown crystalline optical material causing at least three sides of the optical components to be covered by the first cladding material and the second amorphous cladding material.

6. The method of claim 1, wherein the crystalline optical material comprises a III-V compound.

7. The method of claim 6, wherein the III-V compound comprises a III-nitride compound.

8. The method of claim 5, wherein the one or more optical components are part of a passive optical device, the passive optical device comprising two guide layers with first and second dispersion responses that combine to create an anomalous dispersion about a target wavelength.

9. The method of claim 1, wherein the substrate or template comprises an AlN substrate or an AlN template on an $Al_2O_3$ or Si substrate.

10. The method of claim 1, wherein the mask material comprises at least one of $SiO_2$, SiN, and TiN.

11. The method of claim 1, wherein the two or more optical components comprise curved waveguides defined by the patterned portions of the mask material.

12. The method of claim 1, wherein the two or more optical components are part of a passive optical device, the passive optical device including at least one of a waveguide, a ring resonator, and a phase shifter.

13. The method of claim 1, wherein the two or more optical components have a height that is smaller than that of the mask.

14. The method of claim 1, wherein the pattern is used to form an aspect ratio in each of the two or more optical components that is greater than 5, wherein the aspect ratio is a ratio between a thickness of one of the optical components and an adjacent one of the optical components.

15. The method of claim 1, wherein the mask has a thickness that is greater than 200 nm.

16. The method of claim 1, wherein removing the patterned portions of the mask material further comprises etching one or more trenches in the substrate or growth template in the one or more regions, wherein the crystalline optical material is selectively grown in the trenches to form the two or more optical components.

* * * * *